United States Patent
Jung

(10) Patent No.: US 6,819,623 B2
(45) Date of Patent: Nov. 16, 2004

(54) INTEGRATED CIRCUIT MEMORY DEVICES HAVING EFFICIENT COLUMN SELECT SIGNAL GENERATION DURING NORMAL AND REFRESH MODES OF OPERATION AND METHODS OF OPERATING SAME

(75) Inventor: Won-chang Jung, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/392,413

(22) Filed: Mar. 19, 2003

(65) Prior Publication Data

US 2003/0214859 A1 Nov. 20, 2003

(30) Foreign Application Priority Data

May 7, 2002 (KR) .................. 10-2002-0025132

(51) Int. Cl.[7] .............. G11C 8/08; G11C 8/14; G11C 8/12
(52) U.S. Cl. ............. 365/230.03; 365/230.08; 365/63
(58) Field of Search ............ 365/230.03, 230.06, 365/230.04, 222, 63

(56) References Cited

U.S. PATENT DOCUMENTS

| | | | | |
|---|---|---|---|---|
| 5,506,816 A | * | 4/1996 | Hirose et al. | .......... 365/230.06 |
| 5,875,133 A | * | 2/1999 | Miyashita et al. | ..... 365/189.09 |
| 6,031,779 A | * | 2/2000 | Takahashi et al. | .......... 365/226 |
| 6,191,999 B1 | * | 2/2001 | Fujieda et al. | ......... 365/230.06 |
| 6,421,295 B1 | * | 7/2002 | Mao et al. | ............. 365/230.06 |

* cited by examiner

Primary Examiner—Anh Phung
Assistant Examiner—J. H. Hur
(74) Attorney, Agent, or Firm—Myers Bigel Sibley & Sajovec

(57) ABSTRACT

An integrated circuit memory device includes an XY array of memory cell sub-blocks and row and column decoder circuitry that is electrically coupled to the array. The array includes first and second offset grids of sub-word line driver control circuits therein, with each of the sub-word line driver control circuits configured to selectively activate a pair of the memory cell sub-blocks in response to a respective pair of active row and column select signals. In order to improve power consumption requirements when switching back and fourth between normal and refresh modes of operation, the row and column decoder circuitry is configured to drive a selected one of a plurality of row select lines associated with the first grid with an asserted row select signal and a plurality of column select lines associated with the second grid with asserted column select signals during a write operation.

15 Claims, 3 Drawing Sheets

INTEGRATED CIRCUIT MEMORY DEVICES HAVING EFFICIENT COLUMN SELECT SIGNAL GENERATION DURING NORMAL AND REFRESH MODES OF OPERATION AND METHODS OF OPERATING SAME

REFERENCE TO PRIORITY APPLICATION

This application claims priority to Korean Application No. 2002-25132, filed May 7, 2002, the disclosure of which is hereby incorporated herein by reference.

FIELD OF THE INVENTION

The present invention relates to integrated circuit memory devices and methods of operating same and, more particularly, to integrated circuit memory devices having normal and refresh modes of operation.

BACKGROUND OF THE INVENTION

Integrated circuit memory devices may use partial activation techniques to reduce row access cycle times ($t_{RC}$) and power consumption during normal modes of operation, which include writing and reading operations. Partial activation techniques typically utilize a single "global" word line (e.g., row select line) and bit line sense amplifier associated with one of a plurality of memory cell sub-blocks. However, such partial activation techniques are typically not feasible during other modes of operation, including refresh modes of operation. In particular, to reduce refresh cycle times, full activation techniques are used to activate global word lines across all memory cell sub-blocks within a row and also activate a plurality of bit line sense amplifiers associated with these plurality of memory cell sub-blocks. Such full activation techniques typically have greater power consumption requirements than partial activation techniques, particularly if boosted voltage levels are used.

FIG. 1 illustrates a conventional memory device that includes an XY array of memory cell sub-blocks 11 therein. As illustrated, the XY array of blocks 11 spans a plurality of rows (shown as X0, X1, X2, . . . ) and a plurality of columns (shown as Y0, Y1, Y2, Y3, Y0, Y1, . . . , Y3) of memory cell sub-blocks 11. A plurality of sub-word line driver control circuits PXID are also provided. Each of these control circuits PXID is configured to drive sub-word lines (SWD) within a pair of memory cell sub-blocks 11, in response to row select signals provided on row select lines (PXI) and column select signals provided on column select lines (YBLSEL). These row select signals may be referred to as global word line signals.

In FIG. 1, the illustrated control circuits PXID in row 0 of the XY array support respective pairs of blocks (shown as blocks (X0,Y0) and (X0,Y1)). These blocks are highlighted with cross-hatched shading. A row decoder 13 is provided for generating the row select signals and a column decoder 15 is provided for generating the column select signals. During a normal mode of operation, the sub-word lines (SWD) in the highlighted blocks are driven at boosted voltage levels (e.g., Vpp) that typically exceed an on-chip power supply voltage (e.g., Vdd). These sub-word lines are driven in response to a respective row select signal (PXI) and the illustrated plurality of column select signals (YBLSEL). Thus, only a relatively small number of select lines need to be driven during a normal mode of operation. However, during a refresh mode of operation, when full activation is present, it is typical that a much larger number of column select lines are driven to active levels to thereby enable the driving of sub-word lines in all of the blocks 11 within a selected row of the array. These active levels may be boosted voltage levels (e.g., Vpp) in some conventional memory devices. Because of the typically much larger number of column select lines that need to be driven to active levels during a refresh mode of operation, the power consumption requirements during a refresh mode of operation may be significantly greater than the power consumption requirements during a normal mode of operation. Accordingly, a significant disparity in power consumption requirements may be present when switching back and forth between normal and refresh modes of operation. This disparity may complicate the design of voltage boosting circuits that are active during the normal and refresh modes of operation.

Referring now to FIG. 2, another conventional method of operating a memory device in partial activation and full activation modes of operation will be described. In FIG. 2, twelve (12) memory cell sub-blocks 11 from a portion of a larger memory device are illustrated. These blocks 11 span a portion of rows 1–3 (shown as X1–X3) and a portion of columns 0–3 (shown as Y0–Y3). During a normal mode of operation, such as a write operation, the control circuit 21 (PXID) that drives the highlighted pair of blocks 11, is fully activated in response to a corresponding boosted column select signal (shown as YBLSEL1=Vpp) and a corresponding boosted row select signal (shown as PXI1=Vpp). In response to this full activation, the memory cells within the highlighted block 11 may be written with new data. This normal mode of operation, which includes partial activation of one or a selected few blocks 11 within a row, may require significantly less power consumption than a refresh operation that includes driving one row select line and all of the column select lines at boosted voltage levels, so that an entire row of the memory device may be refreshed. Thus, upon transitioning from a normal mode of operation to a refresh mode of operation, a relatively large number of column select lines (shown as YBLSEL0, YBLSEL1, . . . , YBLSEL3, YBLSEL0, . . . ) may have to be switched from ground reference voltages (e.g., Vss) to boosted voltage levels (e.g., Vpp) and this large amount of switching may consume significant amounts of power.

Accordingly, notwithstanding these conventional memory devices that support both normal and refresh modes of operation, there continues to be a need for memory devices that switch from one mode to another mode with reduced power consumption requirements and discrepancies.

SUMMARY OF THE INVENTION

Integrated circuit memory devices according to embodiments of the present invention improve power consumption requirements by reducing the amount of switching current needed by column decoders when switching from normal to refresh modes of operation (and vice versa). This reduction in switching current is achieved by essentially "precharging" unused column select lines during a normal write operation so that they do not have to be precharged at a commencement of a refresh operation when they are used along with other column select lines to perform a write operation on an entire row of the memory device. This early precharging of the unused column select lines also facilitates balancing of the current demands placed on a column decoder (and boosting circuitry therein) during normal and refresh modes of operation.

According to some embodiments of the present invention, an XY array of memory cell sub-blocks is provided. The array includes first and second offset grids of sub-word line driver control circuits therein. Each of these sub-word line driver control circuits is configured to selectively activate a pair of the memory cell sub-blocks in response to a respective pair of active row and column select signals. Row and column decoder circuitry is also provided. The row and column decoder circuitry is configured drive a selected one of a plurality of row select lines associated with the first grid with an asserted row select signal and a plurality of column select lines associated with the second grid with asserted column select signals, during a normal write (or read) operation. The row and column decoder circuitry is further configured to drive a selected one (or selected ones) of a plurality of column select lines associated with the first grid with an asserted column select signal during the write operation, so that one or more pairs of selected sub-blocks may be activated to accept write data.

Still further embodiments of the present invention include methods of operating integrated circuit memory devices having XY arrays of memory cell sub-blocks therein In particular, these methods include driving a first plurality of column select lines, which are electrically coupled to a plurality of inactive sub-word line driver control circuits in a first row of the XY array, with column select signals having boosted voltage levels. This driving step is performed while simultaneously activating at least one sub-word line driver control circuit in a second row of the XY array during an operation to write data into a memory cell sub-block that is electrically coupled to the activated sub-word line driver control circuit. This driving step is followed by the step of driving a second plurality of column select lines, which are electrically coupled to a plurality of sub-word line driver control circuits in the second row of the XY array, with boosted column select signals during a refresh operation. During the refresh mode of operation, the first plurality of column select lines are maintained at their boosted voltage levels.

Still further embodiments of the present invention include methods that cover driving a plurality of column select lines that extend across the XY array with asserted column select signals that are received by a plurality of sub-word line driver control circuits in the XY array. A first row select line, which extends across the XY array, is then driven with an asserted row select signal that is received by at least two of the plurality of sub-word line driver control circuits that are associated with a first row of the XY array, during a write operation. This step is performed concurrently with deasserting a column select signal received by one of the at least two of the plurality of sub-word line driver control circuits in the first row.

DESCRIPTION OF PREFERRED EMBODIMENTS

Figure 1:
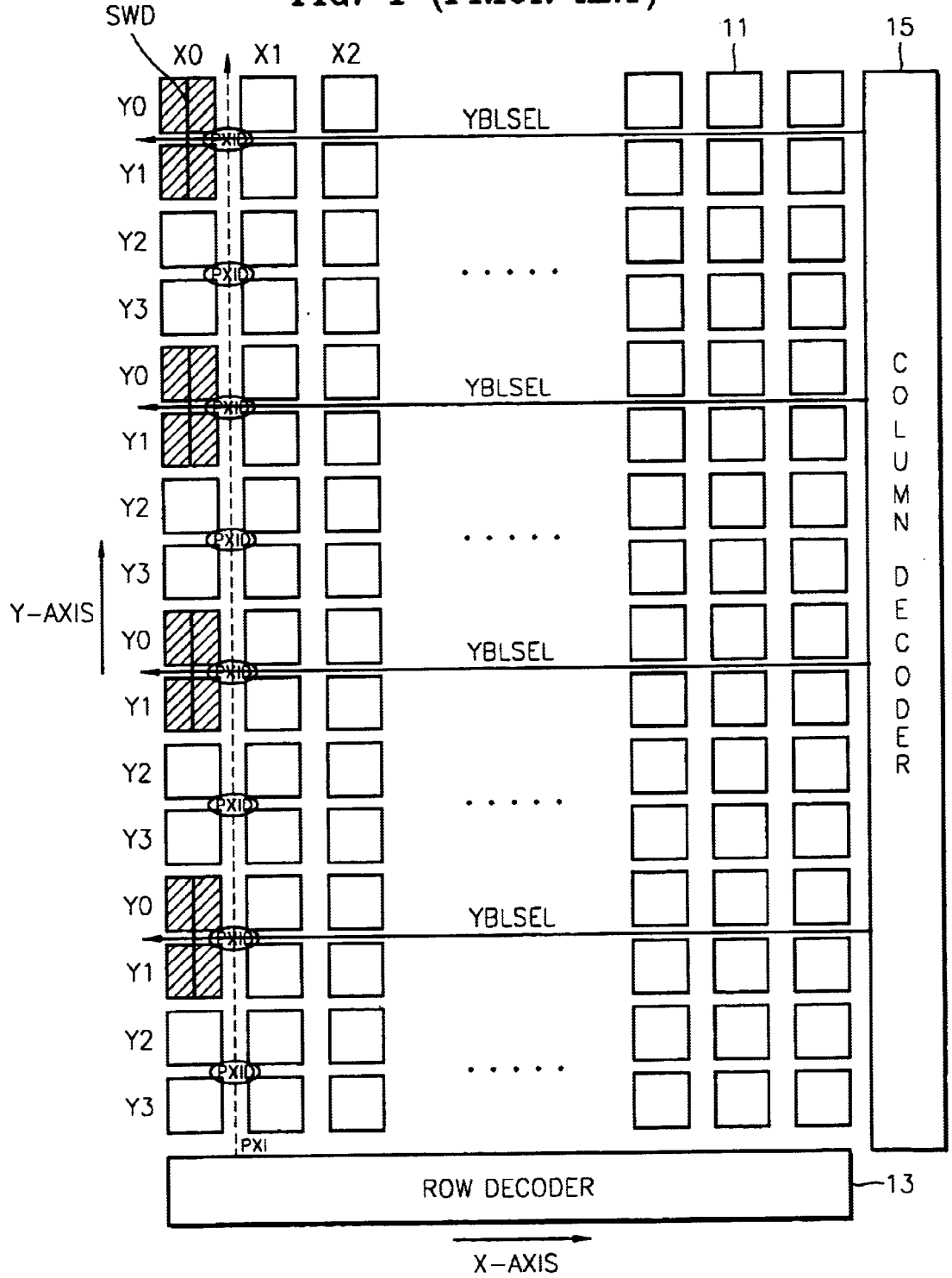
FIG. 1 is a block diagram of a memory device having an array of memory cell sub-blocks therein, according to the prior art.

The present invention will now be described more fully herein with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Signal lines and signals thereon may be referred to using the same names and reference characters. Like numbers refer to like elements throughout the specification.

Figure 3:
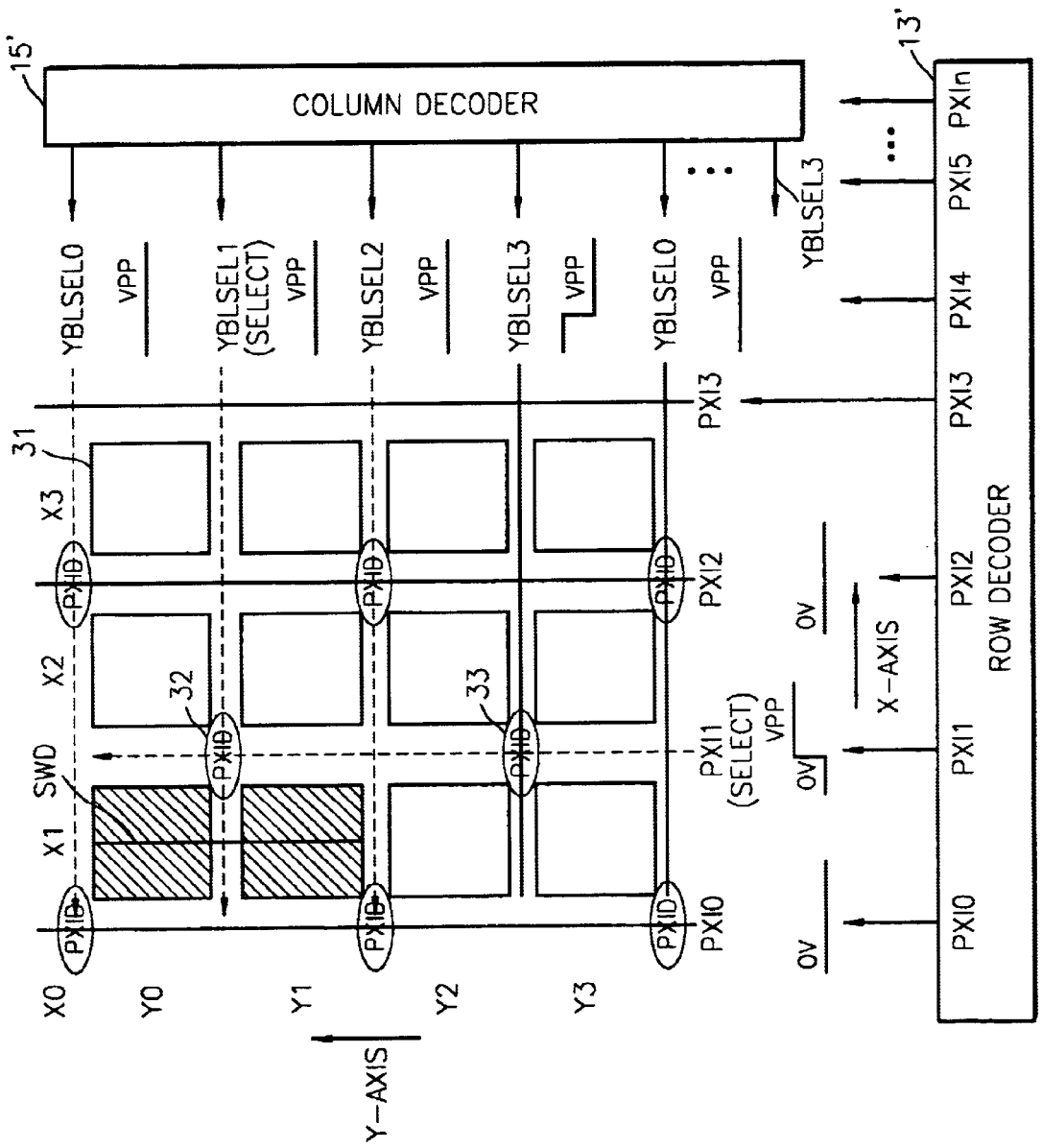
FIG. 3 is a block diagram of a portion of a memory device that is undergoing a normal operation with boosted row and column select signals, according to an embodiment of the present invention.

Referring now to FIG. 3, an integrated circuit memory device according to an embodiment of the present invention will be described. The illustrated memory device includes a two-dimensional array of memory cell sub-blocks 31. Each of these memory cell sub-blocks 31 may include a sub-row of memory cells having a desired length. In FIG. 3, twelve sub-blocks 31 are illustrated as spanning a portion of a memory array. In particular, the twelve sub-blocks 31 are illustrated as spanning rows 1-3 (shown as X1–X3) and columns 0–3 (shown as Y0–Y3) of a much larger memory array. The memory array also includes a plurality of sub-word line driver control circuits, shown as PXID. These control circuits PXID, which may be of conventional design, are arranged into two grids that are offset relative to each other. As illustrated, a first grid of sub-word line driver control circuits PXID includes the control circuits located at the intersections between "even" column select lines YBLSEL0, YBLSEL2 and YBLSEL0 and "even" row select lines PXI0 and PXI2. A second grid of sub-word line driver control circuits PXID includes the control circuits located at the intersections between "odd" column select lines YBLSEL1 and YBLSEL3 and "odd" row select lines PXI1 and PXI3. The first control circuit PXID 32, which is part of the second grid, is configured to drive sub-word lines (SWD) within the two sub-blocks that have been highlighted with cross-hatch shading. The second control circuit PXID 33, which is part of the first grid, is disposed in the same row as the first control circuit 32 and both the first and second control circuits 32 and 33 are responsive to the same row select signal, which is shown as PXI1. In order to activate the first control circuit 32 during a write, read or refresh operation, for example, it is necessary to activate both the first column select line YBLSEL1 and the first row select line PXI. In the illustrated embodiment, these select lines are made active by driving each line with a respective signal that is set high to a boosted voltage level (shown as Vpp). As will be understood by those skilled in the art, a boosted voltage level typically exceeds an internal power supply voltage (Vdd) applied to the circuits within the memory device.

Operation of the memory device of FIG. 3 during a normal mode of operation (e.g., writing or reading) includes setting the column select lines YBLSEL0, YBLSEL1, YBLSEL2, YBLSEL3, YBLSEL0, . . . ,YBLSEL3 to boosted voltage levels to thereby partially activate the control circuits PXID in the first and second grids. Then, in order to write an entry into at least the pair of sub-blocks 31 coupled to the first control circuit PXID 32, the first row select line PXI1 is switched low-to-high to a boosted voltage level. Concurrently with the leading low-to-high edge of the first row select signal PXI1, some (e.g., half) of the "odd" column select lines associated with the second grid of control circuits PXID are switched high-to-low to a ground reference voltage (Vss=0 Volts). These switching operations are performed by row and column decoder circuitry, which may be illustrated as a row decoder block 13' connected to the row select lines and a column decoder block 15' connected to the column select lines.

Figure 2:
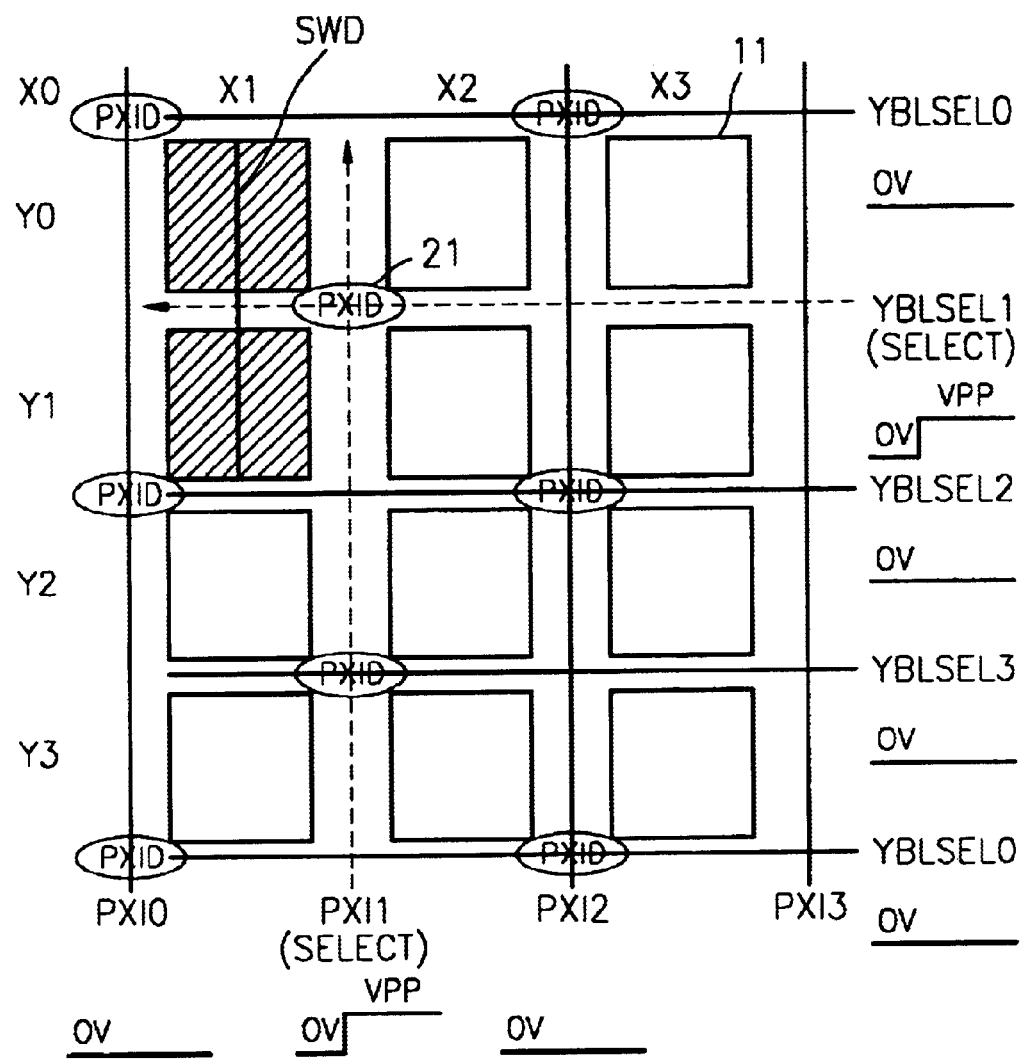
FIG. 2 is a block diagram of a portion of a memory device that is undergoing a normal operation with boosted row and column select signals, according to the prior art.

In the illustrated embodiment, the odd column select lines YBLSEL3 will be switched high-to-low and the other odd column select lines YBLSEL1 will remain high at their boosted voltage levels so that multiple pairs of blocks (i.e., multiple pairs of the blocks (X1,Y0) and (X1, Y1)). Moreover, according to a preferred aspect of the illustrated embodiment, all of the unused "even" column select lines YBLSEL0, YBLSEL2, YBLSEL0, . . . will be held high at their boosted voltage levels. In contrast, all non-selected column select lines (i.e., YBLSEL0, YBLSEL2 and YBLSEL3) will remain low in the conventional memory device of FIG. 2 during an operation to write data to pairs of sub-blocks that are responsive to the odd column select lines YBLSEL1.

In the event a refresh operation follows the above-described "normal" operation to write data to (or read data from) the highlighted pair of sub-blocks 31 (and other pairs of sub-blocks in row 1 that are associated with column select lines YBLSEL1), then only half the "odd" column select lines associated with the second grid of control circuits PXID will need to be switched low-to-high to boosted voltage levels at the commencement of a refresh operation. Thus, according to an aspect of the illustrated embodiment, only one fourth of all the column select lines YBLSEL0–YBLSEL3 will need to be switched high to prepare for a refresh operation. In contrast, in the prior art device of FIG. 2, three fourths of the column select lines (i.e., YBLSEL0 and YBLSEL2–YBLSEL3) will need to be switched low-to-high at a commencement of a refresh operation.

Accordingly, when switching from a normal mode of operation to a refresh mode of operation using the memory device of FIG. 3, reduced power consumption requirements can be achieved. Moreover, the demands placed on the boosted voltage generating circuits (not shown) are typically made more uniform during the normal and refresh modes of operation because many more of the column select signal lines are driven to boosted voltage levels during the normal mode of operation. For example, in the conventional memory device of FIG. 2, three fourths of the column select lines will be switched low-to-high at the commencement of a refresh operation and then three fourths of the column select lines will be switched high-to-low at the commencement of a normal operation that follows the refresh operation. However, in the memory device embodiment of FIG. 3, only one fourth of the column select lines will be switched low-to-high at the commencement of the refresh operation and then one fourth of the column select lines will be switched high-to-low at the commencement of a normal operation (e.g., write operation) that follows the refresh operation. This reduction in the number of switched lines may significantly reduce the power consumption requirements of the memory device.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of operating an integrated circuit memory device having an XY array of memory cell sub-blocks therein, comprising the steps of:

driving a first plurality of column select lines, which are electrically coupled to a plurality of inactive sub-word line driver control circuits in a first row of the XY array, with column select signals having boosted voltage levels, while simultaneously activating a sub-word line driver control circuit in a second row of the XY array during an operation to write data into a memory cell sub-block that is electrically coupled to the activated sub-word line driver control circuit.

2. The method of claim 1, wherein activating a sub-word line driver control circuit comprises activating a plurality of sub-word line driver control circuits in the second row of the XY array during an operation to write data into a plurality of pairs of memory cell sub-blocks.

3. An integrated circuit memory device, comprising:

an XY array of memory cell sub-blocks, said array comprising first and second offset grids of sub-word line driver control circuits therein, with each of the sub-word line driver control circuits configured to selectively activate a pair of the memory cell sub-blocks in response to an active row select signal and an active column select signal; and row and column decoder circuitry that is configured drive to a selected one of a plurality of row select lines associated with the first grid with an asserted row select signal and is further configured to drive a plurality of column select lines associated with the second grid with asserted column select signals during a write operation.

4. The memory device of claim 3, wherein said row and column decoder circuitry is further configured to drive a selected plurality of column select lines associated with the first grid with an asserted column select signal during the write operation.

5. The memory device of claim 3, wherein the first grid of sub-word line driver control circuits spans odds rows and odd columns of said XY array; and wherein the second grid of sub-word line driver control circuits spans even rows and even columns of said XY array.

6. A method of operating an integrated circuit memory device having an XY array of memory cell sub-blocks therein, comprising the steps of:

driving a plurality of column select lines that extend across the XY array with asserted column select signals that are received by a plurality of sub-word line driver control circuits in the XY array; and driving a first row select line that extends across the XY array with an asserted row select signal that is received by at least two of the plurality of sub-word line driver control circuits that are associated with a first row of the XY array during a write operation, while concurrently deasserting a column select signal received by one of the at least two of the plurality of sub-word line driver control circuits.

7. The method of claim 6, wherein said step of driving a plurality of column select lines comprises driving a plurality of column select lines at boosted voltage levels (Vpp).

8. The method of claim 6, wherein each of the plurality of sub-word line driver control circuits is electrically coupled to at least a pair of memory cell sub-blocks in the XY array.

9. The method of claim 6, wherein said step of driving a first row select line comprises concurrently deasserting a plurality of column select signals received by sub-word line driver control circuits associated with the first row.

10. The method of claim 6, wherein said step of driving a first row select line comprises concurrently deasserting a plurality of column select signals received by sub-word line driver control circuits associated with the first row, while maintaining assertion of all of a plurality of column select signals received by sub-word line driver control circuits associated with a second row of the XY array.

11. A method of operating an integrated circuit memory device having an XY array of memory cell sub-blocks therein, comprising the steps of:

driving a first plurality of column select lines that extend across the XY array with asserted first column select signals that are received by a first plurality of sub-word line driver control circuits in a first row of the XY array, while simultaneously driving a second plurality of column select lines that extend across the XY array with asserted second column select signals that are received by a second plurality of sub-word line driver control circuits in a second row of the XY array; and then driving a first row select line that is electrically coupled to the first plurality of sub-word line driver control circuits with an asserted row select signal during a write operation, while concurrently deasserting a plurality of the first column select signals.

12. The method of claim 11, wherein each of the first plurality of sub-word line driver control circuits is electrically coupled to at least a pair of memory cell sub-blocks in the first row.

13. A method of operating an integrated circuit memory device having an XY array of memory cell sub-blocks therein, comprising the steps of:

driving a first plurality of column select lines that extend across the XY array with boosted first column select signals that operate to partially activate a first plurality of sub-word line driver control circuits in a first row of the XY array, while simultaneously driving a second plurality of column select lines that extend across the XY array with boosted second column select signals that operate to partially activate a second plurality of sub-word line driver control circuits in a second row of the XY array; and then driving a first row select line that is electrically coupled to the first plurality of sub-word line driver control circuits with a boosted row select signal, while concurrently deasserting a plurality of the first column select signals and maintaining all of the second column select signals at boosted voltage levels.

14. The method of claim 13, wherein said step of driving a first row select line is performed during a write operation and is followed by the step of reasserting all deasserted ones of the first column select signals during a refresh operation that immediately follows the write operation.

15. An integrated circuit memory device, comprising:

an array of memory cell sub-blocks that spans a plurality of rows and a plurality of columns, said array comprising a first grid of driver control circuits that are located at intersections between even rows and even columns of said array and a second grid of driver control circuits that are located at intersections between odd rows and odd columns of said array;

a column decoder that is configured to drive a first plurality of column select lines with a plurality of asserted first column select signals that are received by the first grid of driver control circuits and is further configured to simultaneously drive a second plurality of column select lines with a plurality of asserted second column select signals that are received by the second grid of driver control circuits, during a write operation; and a row decoder that is configured to drive a first row select line with an asserted row select signal that is received by a first row of driver control circuits in the first grid during a write operation; and wherein said column decoder is further configured to deassert a plurality of first column select signals and maintain all of the second plurality of column select signals at asserted levels, in response to the first row select line being driven with the asserted row select signal during the write operation.

* * * * *

UNITED STATES PATENT AND TRADEMARK OFFICE
CERTIFICATE OF CORRECTION

PATENT NO. : 6,819,623 B2
DATED : November 16, 2004
INVENTOR(S) : Won-chang Jung It is certified that error appears in the above-identified patent and that said Letters Patent is hereby corrected as shown below:

<u>Column 6,</u>
Lines 20 and 21, change "configured drive to" to -- configured to drive --.

Signed and Sealed this

Twenty-second Day of February, 2005

JON W. DUDAS
*Director of the United States Patent and Trademark Office*